US010002226B1

(12) United States Patent
Kim et al.

(10) Patent No.: US 10,002,226 B1
(45) Date of Patent: Jun. 19, 2018

(54) REALISTIC ROADWAY VIRTUALIZATION SYSTEM

(71) Applicant: TOYOTA JIDOSHA KABUSHIKI KAISHA, Toyota-shi, Aichi-ken (JP)

(72) Inventors: BaekGyu Kim, Cupertino, CA (US); Shinichi Shiraishi, San Jose, CA (US)

(*) Notice: Subject to any disclaimer, the term of this patent is extended or adjusted under 35 U.S.C. 154(b) by 271 days.

(21) Appl. No.: 15/013,936

(22) Filed: Feb. 2, 2016

(51) Int. Cl.
*G06F 17/50* (2006.01)

(52) U.S. Cl.
CPC .................. *G06F 17/5095* (2013.01)

(58) Field of Classification Search
USPC ............. 703/2, 8; 434/62, 69; 345/632
See application file for complete search history.

(56) References Cited

U.S. PATENT DOCUMENTS

| | | | | |
|---|---|---|---|---|
| 8,632,339 | B2* | 1/2014 | Bond | G09B 9/042 434/62 |
| 9,082,303 | B2* | 7/2015 | Gueziec | G01C 21/3492 |
| 9,135,754 | B2* | 9/2015 | Ng-Thow-Hing | G06T 19/006 |
| 9,262,853 | B2* | 2/2016 | Mitchell | G06T 11/60 |
| 9,489,842 | B2* | 11/2016 | Gueziec | G01C 21/3492 |
| 9,640,073 | B2* | 5/2017 | Gueziec | G08G 1/0967 |
| 2006/0057544 | A1* | 3/2006 | Bond | G01M 17/0076 434/62 |
| 2008/0108022 | A1* | 5/2008 | Freund | G09B 19/167 434/69 |
| 2013/0293582 | A1* | 11/2013 | Ng-Thow-Hing | G06T 19/006 345/633 |
| 2014/0267393 | A1* | 9/2014 | Mitchell | G06T 11/60 345/632 |

OTHER PUBLICATIONS

Xi Zhao et. al., "Automated Generation of Virtual Scenarios in Driving Simulator from Highway Design Data," Southwest Region University Transportation Center Texas Transportation Institute The Texas A&M University System, (Sep. 2010), pp. 1-50, downloaded Feb. 19, 2016 from https://d2dtl5nnlpfr0r.cloudfront.net/swutc.tamu.edu/publications/technicalreports/476660-00018-1.pdf.
Sven Kreft at al., "Automated Generation of Virtual Roadways Based on Geographic Information Systems," Proceedings of the ASME 2011 International Design Engineering Technical Conferences & Computers and Information in Engineering Conference, (Aug. 28-31, 2011), pp. 1-7.

\* cited by examiner

*Primary Examiner* — Thai Phan
(74) *Attorney, Agent, or Firm* — Burbage Law, P.C.; Jon-Michael Burbage; Elizabeth Ruzich

(57) ABSTRACT

The disclosure includes a system, method and tangible memory for providing a graphical display output including a virtual roadway system for testing an automobile design. The method may include importing a set of roadway realism data. The method may include receiving a mobility input and an accessibility input. The method may include determining a plurality of roadway inputs based on the set of roadway realism data, the mobility input and the accessibility input. The method may include inputting the plurality of roadway inputs into a plurality of fields. The method may include generating a graphical display output including the virtual environment which includes the virtual roadway system. The graphical display output may be generated based on the plurality of roadway inputs. The method may include providing the graphical display output to a client.

20 Claims, 6 Drawing Sheets

REALISTIC ROADWAY VIRTUALIZATION SYSTEM

BACKGROUND

The specification relates to a realistic roadway virtualization system. In particular, the specification relates to a realistic roadway virtualization system that generates a graphical user interface and enables a realistic virtual roadway system to be generated by a designer that may be inexperienced with what is included in a realistic example of a virtual roadway.

Roadway virtualization software exists in the marketplace. Roadway virtualization software is a software package that predicts the performance of vehicles in response to virtualized driver controls (steering, throttle, brakes, clutch and shifting) in a virtual environment. An example of such software includes CarSim and Prescan, among others.

SUMMARY

A realistic roadway virtualization system may include a realism system and a virtualization application. The virtualization application may include roadway virtualization software. In some embodiments, the realism system may improve the performance of a computer including the virtualization application. The realism system may be a plug-in for the virtualization application. Without the realism system, designing a virtual roadway system using the virtualization application may require the user to provide numerous inputs that specify various roadway parameters. The roadway parameters may describe the virtual roadway system to be generated in the virtual environment. Providing these inputs is a long and tedious process that requires the user to have specialized knowledge about how to design a roadway system and what combination of roadway parameters will yield a virtual roadway system that is a realistic approximation of a roadway system that would exist in the real world (i.e., a real world roadway system). The realism system described herein may eliminate the need for specialized knowledge about roadway system design and providing numerous inputs to the virtualization application to design a realistic set of virtual roadway systems.

For example, a user may provide a user input. The user input may include a mobility input and an accessibility input. The user input may be provided via a slider of a graphical user interface so that providing a single user input may define the mobility input and the accessibility input (see, e.g., the "user input area" in the bottom right-hand corner of FIG. 4). The realism system may generate a plurality of roadway parameters describing a virtual roadway system based on the mobility input, the accessibility input and a set of roadway realism data describing a plurality of real world roadway models. The realism system may provide the plurality of roadway parameters to the virtualization application. The virtualization application may generate a virtual roadway system based on the plurality of roadway parameters that were generated by the realism system responsive to the user providing a single user input via the slider of the graphical user interface.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a system to provide a graphical display output including a virtual roadway system for testing an automobile design, the system including: a realistic roadway virtualization system including a non-transitory memory, a processor, a virtualization application including a realism system, where the virtualization application and the realism system are stored in non-transitory memory which is communicatively coupled to the processor; where the virtualization application includes instructions that, responsive to being executed by the processor, cause the processor to generate a virtual environment including a virtual roadway system; where the virtualization application includes a plurality of fields for inputting a plurality of roadway inputs that define a plurality of parameters describing the virtual roadway system; where the virtualization application generates the virtual environment including the virtual roadway system based on the plurality of roadway inputs. The realism system may include instructions that, responsive to being executed by the processor, cause the processor to perform steps including: importing a set of roadway realism data describing a plurality of real world roadway models; receiving a mobility input and an accessibility input, where the mobility input describes a mobility function for the virtual roadway system and the accessibility input describes an accessibility function for the virtual roadway system; determining the plurality of roadway inputs based on the set of roadway realism data, the mobility input and the accessibility input; and inputting the plurality of roadway inputs into the plurality of fields. The system may include the virtualization application generating a graphical display output including the virtual environment, which includes the virtual roadway system, based on the plurality of roadway inputs. The system may also include the virtualization application providing the virtual environment to a client. Other embodiments of this aspect include corresponding computer systems, apparatus, and computer programs recorded on one or more computer storage devices, each configured to perform the actions of the methods.

Implementations may include one or more of the following features. The system where the realism system is a plug-in installed in the virtualization application. The system where the mobility function is a first number that defines an ability of a virtual automobile traveling on the virtual roadway system to move from place to place on the virtual roadway system. The system where the first number is a percentage. The system where the accessibility function is a second number that defines an ability of an automobile to access the virtual roadway system and exit the virtual roadway system. The system where the second number is a percentage. The system where the mobility function is a first number that defines a first ability of an automobile traveling on the virtual roadway system to move from place to place on the virtual roadway system and the accessibility function is a second number that defines a second ability of an automobile to access the virtual roadway system and exit the virtual roadway system, wherein a sum of the first number and the second number is 1 or 100%. The system where the plurality of real world roadway models is generated based on a plurality of real world roadway systems. The system where the mobility function and the accessibility function are provided as inputs by a design engineer to the client. The system where the plurality of real world roadway models are each associated with (1) a mobility value, (2) an accessibility value and (3) a set of roadway parameters that describe a real world roadway system, and determining the plurality of roadway inputs includes selecting, from the plurality of real world roadway models, a real world road model whose mobility value and accessibility value at least substantially match the mobility function and the accessibility function and then determining that the set of roadway parameters associated with the selected roadway model are the plurality of roadway inputs. The system where the realism system analyses the plurality of real world roadway models and assigns the mobility value and the accessibility value to each real world roadway model included in the plurality of real world roadway models. The system where the realism system estimates, for each real world roadway model included in the plurality of real world roadway models, an ability of an automobile traveling on the real world roadway system to move from place to place on the real world roadway system and assigns the mobility value to the real world roadway model based on the estimate. The system where the realism system estimates, for each real world roadway model included in the plurality of real world roadway models, an ability of an automobile to access the real world roadway system and exit the real world roadway system and assigns the accessibility value to the real world roadway model based on the estimate. Implementations of the described techniques may include hardware, a method or process, or computer software on a computer-accessible medium.

One general aspect includes a method to provide a graphical display output including a virtual roadway system for testing an automobile design, the method including: importing a set of roadway realism data describing a plurality of real world roadway models to a realism system included in a virtualization application, where the virtualization application includes instructions that, responsive to being executed by a processor, cause the processor to generate a virtual environment including a virtual roadway system and the virtualization application includes a plurality of fields for inputting a plurality of roadway inputs that define a plurality of parameters describing the virtual roadway system; receiving, by the realism system, a mobility input and an accessibility input, where the mobility input describes a mobility function for a virtual roadway system and the accessibility input describes an accessibility function for the virtual roadway system; determining, by the realism system, the plurality of roadway inputs based on the set of roadway realism data, the mobility input and the accessibility input; and inputting, by the realism system, the plurality of roadway inputs into the plurality of fields included in the virtualization application; generating, by the virtualization application, a graphical display output including the virtual environment which includes the virtual roadway system, where the graphical display output is generated based on the plurality of roadway inputs; and providing, by the virtualization application, the graphical display output including the virtual environment and the virtual roadway system to a client. Other embodiments of this aspect include corresponding computer systems, apparatus, and computer programs recorded on one or more computer storage devices, each configured to perform the actions of the methods.

Implementations may include one or more of the following features. The method where the realism system is a plug-in installed in the virtualization system. The method where the mobility function is a first percentage that defines an ability of a virtual automobile traveling on the virtual roadway system to move from place to place on the virtual roadway system and the accessibility function is a second percentage that defines an ability of the virtual automobile to access the virtual roadway system and exit the virtual roadway system and a sum of the first percentage and the second percentage equals 100% or 1. The method where the plurality of real world roadway models are each associated with (1) a mobility value, (2) an accessibility value and (3) a set of roadway parameters that describe a real world roadway system, and determining the plurality of roadway inputs includes selecting, from the plurality of real world roadway models, a real world road model whose mobility value and accessibility value at least substantially match the mobility function and the accessibility function and then determining that the set of roadway parameters associated with the selected roadway model are the plurality of roadway inputs. The method where the realism system analyses the plurality of real world roadway models and assigns a mobility value and an accessibility value to each real world roadway model included in the plurality of real world roadway models and where the realism system estimates, for each real world roadway model included in the plurality of real world roadway models, an ability of an automobile traveling on a real world roadway system to move from place to place on the real world roadway system and assigns the mobility value to the real world roadway model based on the estimate. The method where the realism system estimates, for each real world roadway model included in the plurality of real world roadway models, an ability of an automobile to access the real world roadway system and exit the real world roadway system and assigns the accessibility value to the real world roadway model based on the estimate. Implementations of the described techniques may include hardware, a method or process, or computer software on a computer-accessible medium.

One general aspect includes a non-transitory memory including computer code which, when executed by a processor, causes the processor to perform steps including: importing a set of roadway realism data describing a plurality of real world roadway models to a realism system that is a plug-in installed in a virtualization application, where the virtualization application includes instructions that, responsive to being executed by the processor, cause the processor to generate a virtual environment including a virtual roadway system and the virtualization application includes a plurality of fields for inputting a plurality of roadway inputs that define a plurality of parameters describing the virtual roadway system; generating, by the realism system, a first graphical display output including a slider input portion that includes a graphical slider; receiving, by the realism system, a user input set that consists of a mobility input and an accessibility input, where the user input is provided by a user of a client via the slider input portion and the mobility input describes a mobility function for a virtual roadway system and the accessibility input describes an accessibility function for the virtual roadway system, where the slider input portion is configured so that sliding the graphical slider provides both the mobility input and the accessibility input; determining, by the realism system, the plurality of roadway inputs based on the set of roadway realism data and the user input; and inputting, by the realism system, the plurality of roadway inputs into the plurality of fields included in the virtualization application; generating, by the virtualization application, a second graphical display output including the virtual environment which includes the virtual roadway system, where the second graphical display output is generated based on the plurality of roadway inputs; and providing, by the virtualization application, the second graphical display output including the virtual environment and the virtual roadway system to the client. Other embodiments of this aspect include corresponding computer systems, apparatus, and computer programs recorded on one or more computer storage devices, each configured to perform the actions of the methods.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1A:
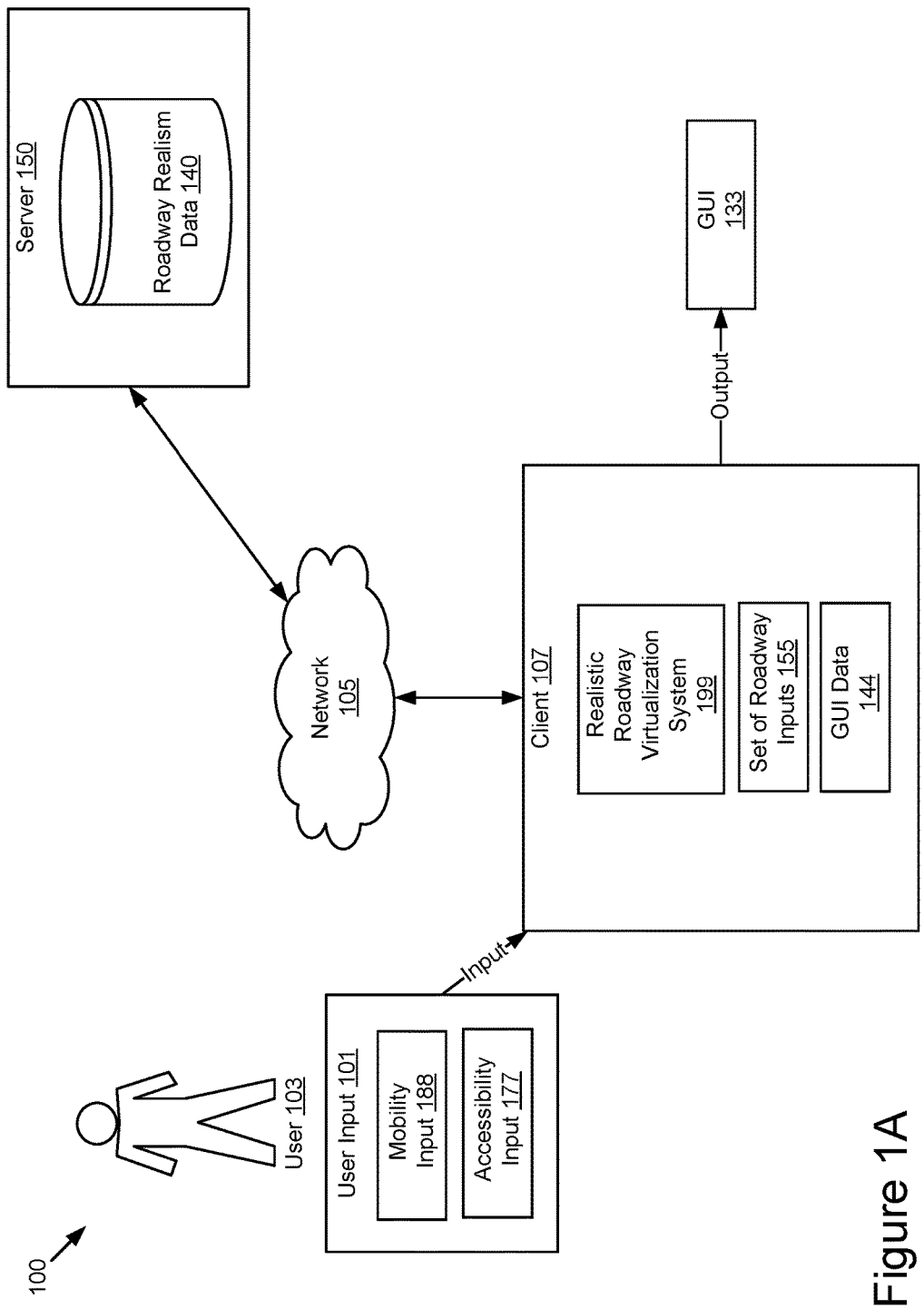
FIG. 1A is a block diagram illustrating an example operating environment for a realistic roadway virtualization system.

Roadway virtualization software exist in the marketplace. Roadway virtualization software is a software package that predicts the performance of vehicles in response to driver controls (steering, throttle, brakes, clutch and shifting) in a virtual environment. It may also be used to test the performance of an automobile design. An example of such software includes CarSim and Prescan, among others.

Automobiles are designed by automobile design engineers. These automobile designs include hardware elements and software elements. The performance of these hardware elements and software elements should be tested in a virtual environment prior to deploying the automobile design as an automobile in the real world. Roadway virtualization software allows automobile design engineers to design a virtual environment where their automobile designs may be tested in a virtual environment before they are deployed in the real world.

To utilize the roadway virtualization software, currently an automobile design engineer must design a number of virtual roadway systems in a virtual environment. For example, the automobile design engineer must input many different roadway parameters into the roadway virtualization software. These roadway parameters define a virtual roadway system included in the virtual environment and the roadway virtualization software generates the virtual environment including the virtual roadway system based on these inputs.

The inputs required to generate the virtual roadway system in the virtual environment may be numerous and complicated. These inputs generally define the specifications of the roadway. For example, these inputs include one or more of the following: speed limit; total number of lanes included in the roadway; total number of right-hand lanes included in the roadway; total number of left-hand lanes included in the roadway; roadway length; land width for each lane included in the roadway; shoulder width; foreslope on the left or right-hand side; roadway cross-slope on the left or right-hand side; placement curves along the roadway; angle of curves along the roadway; roadway slope inside of curves along the roadway; coefficients of friction along the roadway, transitions from coefficients for friction along the roadway and the placement of these transitions on the roadway, etc. Different real world roadway systems described by the roadway realism data 140 may be described by different combinations of roadway parameters.

The process of providing these inputs is frequently tedious and boring for the design engineer. It may require dozens, hundreds or possibly thousands of different inputs from the automobile design engineer in order to generate a single roadway system in the virtual environment.

Research and experience has shown that the roadway parameter inputs provided by automobile design engineers are frequently uninformed and incorrect since, although design engineer may be very skilled at designing automobiles, they may not have any experience in designing roadway systems and have no knowledge about the qualities or attributes of a "realistic" roadway system. It is almost as if the existing roadway virtualization software products on the market expect automobile design engineers to be experienced civil engineers, which is frequently not the case.

With the advent of autonomous vehicles, it is not enough to just test the performance of an automobile design on a realistic roadway; the automobile design must also be tested in a large combination of roadway systems that will test the performance of the automobile software in both typical situations that the automobile would experience on a frequent basis in the real world (e.g., day to day, hour to hour, minute to minute) and extreme situations that the automobile would experience on an infrequent basis in the real world (e.g., once a year, once a every two or three years, once during the lifetime of the automobile). However, automobile design engineers generally do not have the knowledge necessary to correctly create a combination of realistic systems that will thoroughly test their automobile design so that it is known to be safe in typical situations as well as extreme situations.

If fact, experimentation and experience has shown that even the most experienced civil engineers do not have the knowledge necessary to correctly create a combination of realistic systems that will thoroughly test automobile designs so that it is known to be safe in typical situations as well as extreme situations since these engineers do not know every circumstance that the automobile might experience, and so, the combination of roadway systems they construct to test automobile designs always omit many meaningful extreme situations that some automobiles constructed based on the automobile design will experience eventually if the automobile design is used to manufacture a commercial vehicle.

As the manufacturers of autonomous vehicles may be expected to be liable for the poor decisions of their autonomous vehicles, automobile manufacturers are not willing to release a commercially available autonomous vehicle that is tested using only vehicle environments that are designed by humans.

As a result, the existing roadway virtualization software products are not very useful for automobile design engineers. They are too time consuming for use by automobile design engineers and do not yield good virtual environments for testing automobile designs since they require specialized knowledge which may not be known to a typical automobile design engineer.

In some implementations, a realistic roadway may include a virtual roadway that is an approximation of a roadway system that would exist in the real world (i.e., a real world roadway system).

A realistic roadway virtualization system may include a realism system and a virtualization application. The virtualization application may include roadway virtualization software. In some embodiments, the realism system may improve the performance of a computer including the virtualization application. The realism system may be a plug-in for the virtualization application. Without the realism system, designing a virtual roadway system using the virtualization application may require the user to provide numerous inputs that specify various roadway parameters. The roadway parameters may describe the virtual roadway system to be generated in the virtual environment. Providing these inputs is a long and tedious process that requires the user to have specialized knowledge about how to design a roadway system and what combination of roadway parameters will yield a virtual roadway system that is a realistic approximation of a roadway system that would exist in the real world (i.e., a real world roadway system). The realism system may eliminate the need for specialized knowledge about roadway system design and providing numerous inputs to the virtualization application to design a realistic set of virtual roadway systems.

For example, a user may provide a user input. The user input may include a mobility input and an accessibility input. The user input may be provided via a slider of a graphical user interface so that providing a single user input may define the mobility input and the accessibility input (see, e.g., the "user input area" in the bottom right-hand corner of FIG. 4).

The mobility input and the accessibility input may each be a percentage, and they may each be configured so that the sum of these two inputs equals 100% or some equivalent value (such as "1" for instances where decimals are used to represent percentages). For example, assume the user specifies that the mobility input is "60%." If the mobility input is 60%, then the accessibility input is 40% since the sum of mobility and accessibility input equal 100%. In other words, the greater the mobility of a roadway system (e.g., an interstate), then the less the accessibility value for that roadway system (e.g., an interstate may only be accessed by on ramps at each exit of the interstate, which makes the interstate harder to access).

In some embodiments, the realism system may generate a plurality of roadway parameters describing a virtual roadway system based on the mobility input, the accessibility input and a set of roadway realism data describing a plurality of real world roadway models. The realism system may provide the plurality of roadway parameters to the virtualization application. The virtualization application may generate a virtual roadway system based on the plurality of roadway parameters that were generated by the realism system responsive to the user providing a single user input via the slider of the graphical user interface.

In some embodiments, the realism system may cause the virtualization application to generate a plurality of virtual roadway systems based on the mobility input and the accessibility input. Each of the plurality of virtual roadway systems may be an example of a realistic roadway system that would exist in the real world. The plurality of virtual roadway systems outputted may be configured so that it includes typical and extreme scenarios for testing the automobile design.

Classification of Roadway Systems

Functional classification is the process by which roadways (streets and highways) are grouped into classes, or systems, according to the character of traffic service that they are intended to provide. There are three highway functional classifications: arterial, collector, and local roads. All streets and highways are grouped into one of these classes, depending on the character of the traffic (i.e., local or long distance) and the degree of land access that they allow.

Arterial roadways generally provide the highest level of service at the greatest speed for the longest uninterrupted distance, with some degree of access control.

Collector roadways generally provide a less highly developed level of service at a lower speed for shorter distances by collecting traffic from local roads and connecting them with arterials.

Local roadways include roadways not defined as arterials or collectors; primarily provides access to land with little or no through movement.

Arterial, collector and local roadways may be further classified based on their mobility and accessibility. A mobility criterion of a roadway may describe an ability of an automobile traveling on the roadway to move from place to place on the roadway. An accessibility criterion of a roadway may describe an ability of an automobile to access and exit the roadway. Arterial roadways may generally have a higher mobility criterion (e.g., >60%) and a lower accessibility criterion (e.g., <40%). Collector roadways may general achieve a substantial balance between mobility and accessibility. Local roadways may generally have a lower mobility criterion (e.g., <60%) and a higher accessibility criterion (e.g., >40%).

Example System Overview

FIG. 1A illustrates a block diagram of one embodiment of an environment 100 for a realistic roadway virtualization system 199. The environment 100 includes a client 107 and a server 150. In the illustrated embodiment, these entities of the environment 100 may be communicatively coupled via a network 105. The client 107 may be operated by a user 103. The user 103 may provide a user input 101. The client 107 may provide a graphical user interface ("GUI") 133 as an output responsive to the user input 101.

The server 150 and the client 107 can be used by way of example. While FIG. 1A illustrates one server 150 and one client 107, the disclosure applies to a system architecture having one or more servers 101 and one or more clients 107. Furthermore, although FIG. 1A illustrates one network 105 coupled to server 150 and the client 107, in practice one or more networks 105 can be connected to these entities. While FIG. 1A includes one realistic roadway virtualization system 199 included in the client 107, the environment 100 could include one or more realistic roadway virtualization system 199 included in one client 107 or across more than one client 103.

The network 105 can be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices may communicate. In some implementations, the network 105 may be a peer-to-peer network. The network 105 may also be coupled to or include portions of a telecommunications network for sending data in a variety of different communication protocols. In some implementations, the network 105 includes Bluetooth® communication networks or a cellular communications network for sending and receiving data via short messaging service (SMS), multimedia messaging service (MMS), hypertext transfer protocol (HTTP), direct data connection, WAP, e-mail, etc. In some implementations, the network 105 may include a GPS satellite for providing GPS data to the client 107. The network 105 may be a mobile data network such as 3G, 4G, LTE, Voice-over-LTE ("VoLTE"), or any other mobile data network or combination of mobile data networks.

The server 150 can be a hardware server that includes a processor, a memory and network communication capabilities. The server 150 may be communicatively coupled to the network 105.

The server 150 may include roadway realism data 140. The roadway realism data 140 may describe a plurality of real world roadway models. The plurality of real world roadway models may include a plurality of roadway parameters. The plurality of roadway parameters may describe a plurality of roadway systems that exist in the real world (i.e., "real world roadway systems").

For example, the roadway realism data 140 may describe, for each of the real world roadways described by the real world roadway systems described by the roadway realism data 140, one or more of the following roadway parameters: speed limit; total number of lanes included in the roadway; total number of right-hand lanes included in the roadway; total number of left-hand lanes included in the roadway; roadway length land width for each lane included in the roadway; the dividing line striping option for each lane transition (e.g., no dividing line; broken or dashed line; solid double line; solid line or left and broken line on the right; broken line on the left and solid line on the right; double solid line); the edge line for each outside lane; the visibility of dividing line options or edge line by automobile sensors such as cameras (e.g., is the dividing line or edge line obscured or old so that is hard to identify by the sensors of an autonomous vehicle); shoulder width; foreslope on the left or right-hand side; roadway cross-slope on the left or right-hand side; placement of curves along the roadway; angle of curves along the roadway; roadway slope inside of curves along the roadway; coefficients of friction along the roadway, transitions from coefficients for friction along the roadway and the placement of these transitions on the roadway, etc. Different real world roadway systems described by the roadway realism data 140 may be described by different combinations of roadway parameters.

In some embodiments, one or more of the real world roadway models described by the roadway realism data 140 may include a realism value or an accessibility value. The realism value or the accessibility value may be associated with a real world roadway system that is described by the real world roadway models. The mobility value may be a number that defines an ability of an automobile traveling on the real world roadway system to move from place to place when traveling on the real world roadway system. The accessibility value may be a number that defines an ability of an automobile traveling on the real world roadway system to access the real world roadway system (e.g., access on an on-ramp) and exit the real world roadway system (e.g., access an off-ramp).

In some embodiments, each real world roadway system associated with the roadway realism data 140 includes an associated mobility value or an associated accessibility value. In some embodiments, less than each of the real world roadway systems associated with the roadway realism data 140 includes an associated mobility value or an associated accessibility value.

The server 150 may transmit the roadway realism data 140 to the client 107 via the network 105. The client 107 may store the roadway realism data 140 in a non-transitory memory that is included in the client 107 or accessible by the client 107.

The client 107 may include a processor-based computing device. For example, the client 107 may include one or more of the following: a personal; a special-purpose computing device; a laptop; a tablet computer; a smartphone; a set-top box; a smart television; wearable device; etc. The client 107 may be communicatively coupled to the network 105. The client 107 may include conventional peripherals for receiving one or more inputs and providing one or more outputs.

The client 107 may include one or more of the following: a realistic roadway virtualization system 199; a set of roadway inputs 155; and GUI data 144.

The realistic roadway virtualization system 199 may include a realism system and a virtualization application. The virtualization application may include roadway virtualization software. The realism system and the virtualization application and described in more detail below with reference to FIG. 2 (elements 299 and 210, respectively).

In some embodiments, the realism system may improve the performance of a computer including the virtualization application. The realism system may be a plug-in for the virtualization application. Without the realism system, designing a virtual roadway system using the virtualization application may require the user to provide numerous inputs that specify various roadway parameters such as the set of roadway inputs 155.

The set of roadway inputs 155 may include data describing a virtual roadway system. For example, the set of roadway inputs 155 may describe two or more of the following roadway parameters for a virtual roadway system: speed limit; total number of lanes included in the virtual roadway system; total number of right-hand lanes included in the virtual roadway system; total number of left-hand lanes included in the virtual roadway system; roadway length for the virtual roadway system; land width for each lane included in the virtual roadway system; the dividing line striping option for each transition of the virtual roadway system (e.g., no dividing line; broken or dashed line; solid double line; solid line or left and broken line on the right; broken line on the left and solid line on the right; double solid line); the edge line for each outside lane included in the virtual roadway system; the visibility of dividing line options or edge line by automobile sensors such as cameras (e.g., is the dividing line edge line obscured or old so that is hard to identify by the sensors of an autonomous vehicle); shoulder width for outside lanes included in the virtual roadway system; foreslope on the left or right-hand side; roadway cross-slope on the left or right-hand side; placement of curves along the virtual roadway system; angle of curves along the virtual roadway system; roadway slope inside of curves along the virtual roadway system; coefficients of friction along the virtual roadway system, transitions from coefficients for friction along the virtual roadway system and the placement of these transitions on the virtual roadway system, etc.

The user 103 is a human user of the client 107. The user 103 may be an automobile design engineer or some other human user. The user 103 provides a user input 101 to the realistic roadway virtualization system 199. The user input may be provided via a slider of a GUI so that providing a single user input may define the mobility input and the accessibility input (see, e.g., the "user input area" in the bottom right-hand corner of FIG. 4).

The user input 101 may include data that defines a mobility input 188 and an accessibility input 177.

The mobility input 188 may include data that describes a mobility function for a virtual roadway system. The mobility function may include a first number that defines an ability of a virtual automobile traveling on the virtual roadway system to move from place to place on the virtual roadway system. The accessibility input 177 may include data that describes an accessibility function for a virtual roadway system. The accessibility function may include a second number that defines an ability of a virtual automobile to access the virtual roadway system and exit the virtual roadway system.

One or more of the first number and the second number included in the user input 101 may include a percentage. The first number and the second number may be configured so that a sum of the first number and the second number is 1, 100% or an equivalent number indicating completeness.

In some embodiments, the realism system included in the realistic roadway virtualization system 199 may generate the set of roadway inputs 155 describing a virtual roadway system based on the mobility input 188, the accessibility input 188 and roadway realism data 140. The realism system may provide the set of roadway inputs 155 to the virtualization application.

In some embodiments, the virtualization application included in the realistic roadway virtualization system 199 may generate a virtual roadway system based on the set of roadway inputs 155. The virtual roadway system may be included in a virtual environment generated by the virtualization application for testing an automobile design. The automobile design may be represented by a virtual automobile included in the virtual environment.

The realistic roadway virtualization system 199 may provide a GUI 133 as an output. The GUI 133 may include the virtual environment for testing an automobile design.

In some implementations, the realistic roadway virtualization system 199 may include an electronic device configured to perform one or more steps of the method 300 described below with reference to FIGS. 3A and 3B.

In some implementations, the realistic roadway virtualization system 199 can be implemented using hardware including a field-programmable gate array ("FPGA") or an application-specific integrated circuit ("ASIC"). In some other implementations, the realistic roadway virtualization system 199 can be implemented using a combination of hardware and software. The realistic roadway virtualization system 199 may be stored in a combination of the devices and servers, or in one of the devices or servers. The realistic roadway virtualization system 199 may include code and routines configured to perform one or more steps of the method 300 described below with reference to FIGS. 3A and 3B when executed by a processor, such as processor 225, described below with reference to FIG. 2.

The realistic roadway virtualization system 199 will be described in more detail below with reference to FIGS. 1B and 2.

Figure 1B:
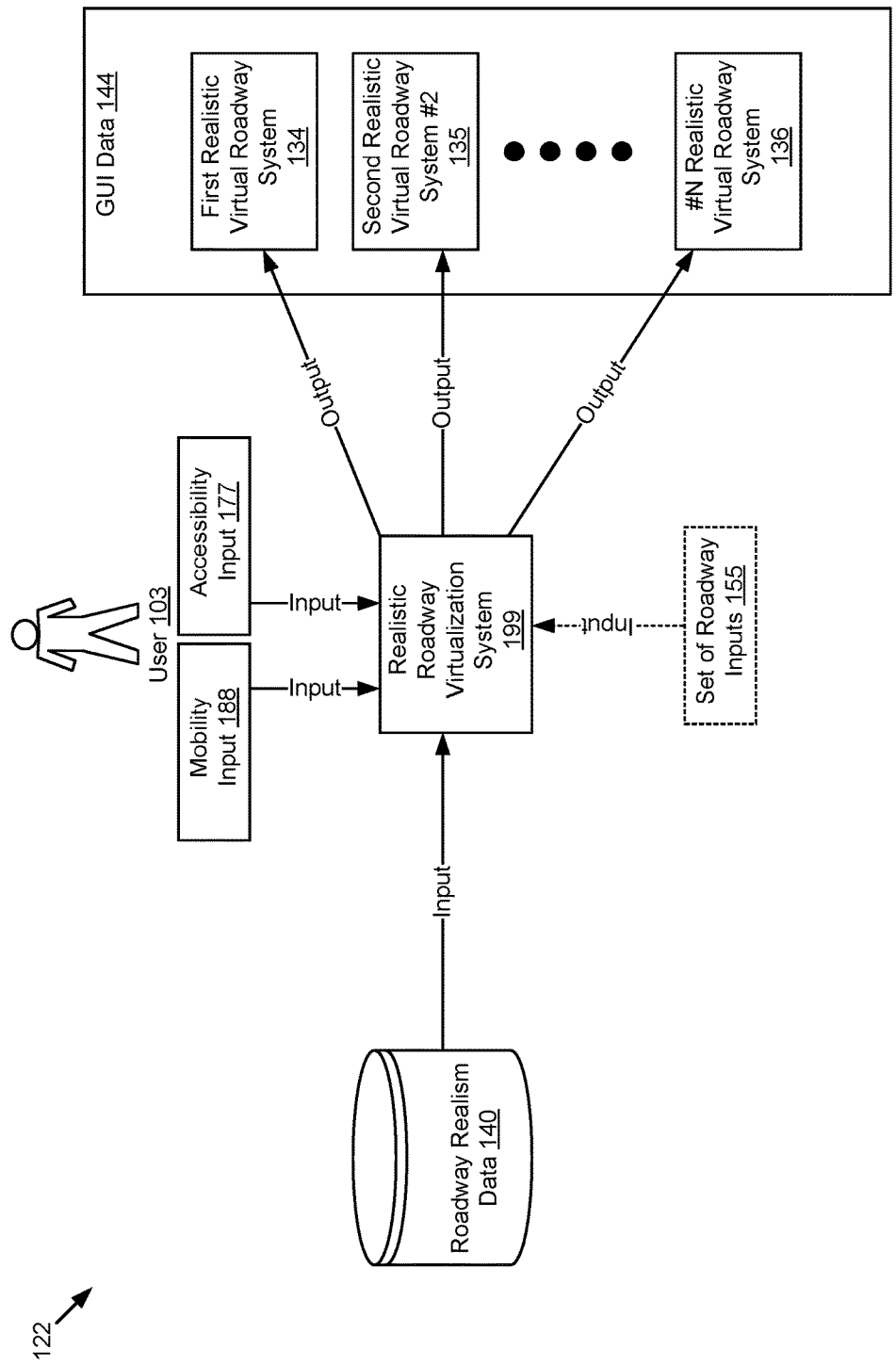
FIG. 1B is a block diagram illustrating an example process flow for a realistic roadway virtualization system.

Referring now to FIG. 1B, depicted is a block diagram illustrating an example process flow 122 for a realistic roadway virtualization system 199.

The realistic roadway virtualization system 199 may receive the roadway realism data 140 as an input. Optionally, the roadway realism data 140 may be coded in the realistic roadway virtualization system 199 at design time.

The realistic roadway virtualization system 199 may receive a mobility input 188 and an accessibility input 177. The mobility input 188 and the accessibility input 177 may be included in a single user input. The user 103 may provide the mobility input 188 and the accessibility input 177.

The set of roadway inputs 155 are depicted in a dashed line in FIG. 1B to indicate that they are an optional input to the realistic roadway virtualization system 199.

The realistic roadway virtualization system 199 outputs a set of GUI data 144. The GUI data 144 may include graphical data for causing a monitor or some other peripheral to display a GUI.

The GUI data 144 may include graphical data for displaying a plurality of realistic virtual roadway systems.

The plurality of realistic virtual roadway systems may include any positive number of realistic virtual roadway systems (i.e., 1 to N). For example, the plurality may include a first realistic virtual roadway system 134, a second realistic virtual roadway system 135 and a #N realistic virtual roadway system 136 (referred to individually as "the realistic virtual roadway system" or collectively as "the plurality of realistic virtual roadway systems 134, 135, 136").

In some embodiments, the plurality of realistic virtual roadway systems 134, 135, 136 include a plurality of virtual roadway systems generated by the realistic roadway virtualization system 199 based at least in part on the mobility input 188, the accessibility input 177 and at least a portion of the roadway realism data 140.

For example, the roadway realism data 140 may describe plurality of real world roadway models and a plurality of roadway parameters for each of these models. The different real world roadway models described by the roadway realism data 140 may also be associated with its own mobility value or accessibility value. For example, each of the real world roadway models included in the roadway realism data 140 may include its own set of roadway parameters and be associated with (1) a mobility value and (2) an accessibility value. The realism system of the realistic roadway virtualization system 199 may select, from the plurality of real world roadway models described by the roadway realism data 140, a plurality of real world road models whose mobility values and accessibility values at least substantially match the mobility function and the accessibility function included in the mobility input 188 and the accessibility input 177, respectively. The realistic roadway virtualization system 199 may then determine that the set of roadway parameters associated with the selected roadway models are the plurality of roadway inputs used by the realistic roadway virtualization system 199 to generate the virtual roadway systems that are included in the virtual environment.

When selecting a plurality of real world road models whose mobility values and accessibility values at least substantially match the mobility function and the accessibility function, the realism system of the realistic roadway virtualization system 199 may configure the selection so that the plurality of realistic virtual roadway systems 134, 135, 136 includes typical and extreme scenarios for testing the automobile design. For example, the realism system may include distribution data that describes a distribution of scenarios that should be included in the plurality of realistic virtual roadway systems 134, 135, 136 and the realism system operates a subroutine to check the plurality of realistic virtual roadway systems 134, 135, 136 to ensure that the distribution is satisfied.

In some embodiments, the realism system of the realistic roadway virtualization system 199 analyses the plurality of real world road models included in the roadway realism data 140 and assigns a mobility value and an accessibility value to each real world road model included in the plurality of real world road models. For example, the realism system may estimate, for each real world road model included in the plurality of real world road models, an ability of an automobile traveling on a real world roadway system constructed based on that model to move from place to place on the real world roadway system; the realism system may assign the mobility value to the real world road model based on the estimate. In another example, the realism system may estimate, for each real world road model included in the plurality of real world road models, an ability of an automobile to access the real world roadway system and exit the real world roadway system; the realism system may assign the accessibility value to the real world road model based on the estimate.

Example Electronic Devices

Figure 2:
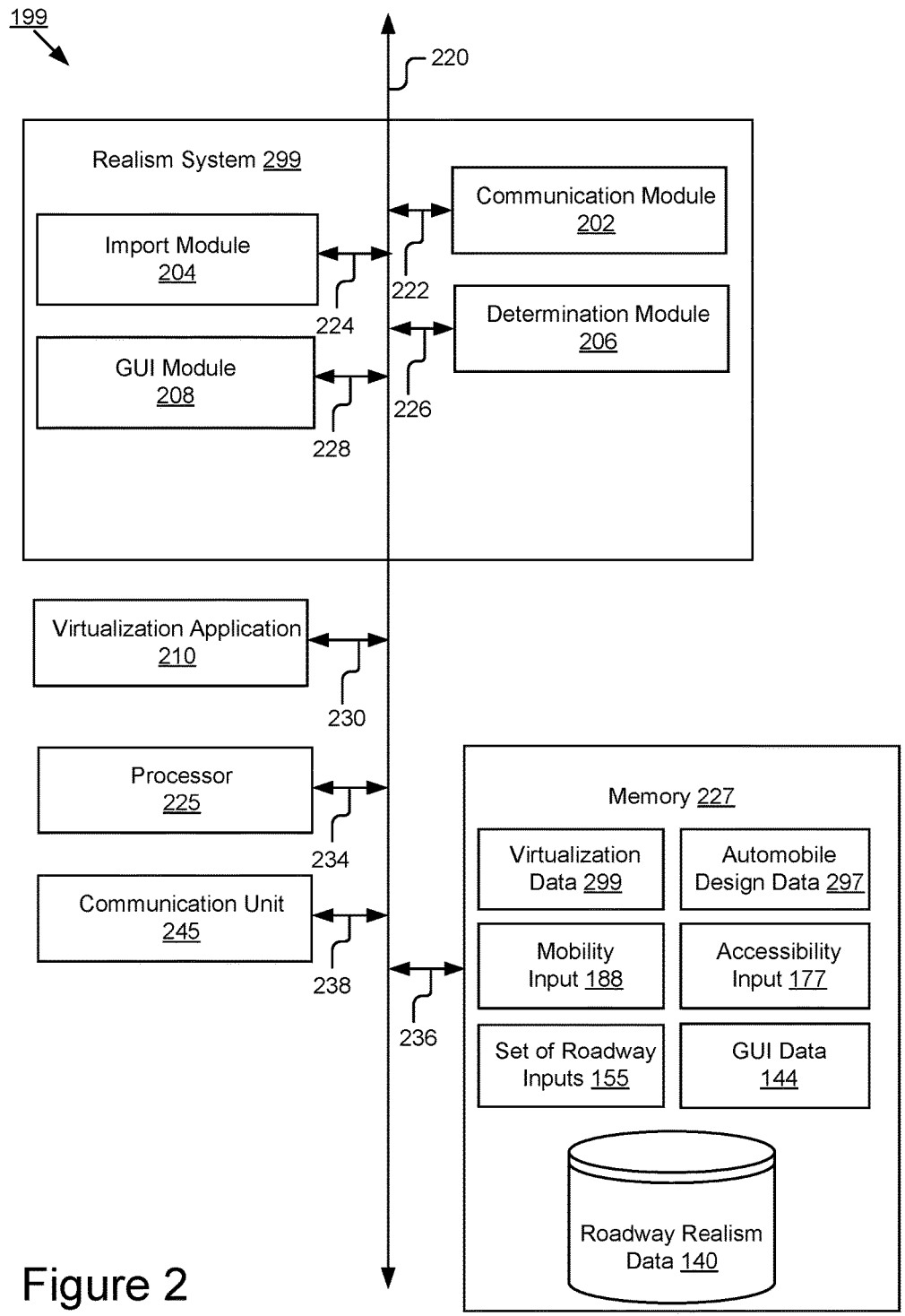
FIG. 2 is a block diagram illustrating an example realistic roadway virtualization system.

FIG. 2 is a block diagram illustrating an example realistic roadway virtualization system 199. In some implementations, the realistic roadway virtualization system 199 may include an electronic device programmed or configured to perform one or more blocks of the method 300 described below with reference to FIGS. 3A and 3B. The realistic roadway virtualization system 199 may be an element of one or more of the client 107 or the server 150. In some implementations, the realistic roadway virtualization system 199 may include a special-purpose computing device configured to provide some or all of the functionality described above with reference to the realistic roadway virtualization system 199 or below with reference to method 300 described below with reference to FIGS. 3A and 3B.

The realistic roadway virtualization system 199 may include a realism system 299, a virtualization application 210, a processor 225, a memory 227 and a communication unit 245. The components of the realistic roadway virtualization system 199 are communicatively coupled by a bus 220. In some embodiments, the components of the realistic roadway virtualization system 199 are local to the same hardware so that the bus 220 is not necessary for communication among the components of the realistic roadway virtualization system 199. In some embodiments, communication structures or methods other than the bus 220 may be implemented.

The memory 227 may include one or more of the following elements: the roadway realism data 140; the mobility input 188; the accessibility input 177; the set of roadway inputs 155; the GUI data 144; the virtualization data 299; and the automobile design data 297. The following elements were described above with reference to FIG. 1A or 1B, and so, their descriptions will not be repeated here: the roadway realism data 140; the mobility input 188; the accessibility input 177; the set of roadway inputs 155; and the GUI data 144.

The virtualization application 210 is communicatively coupled to the bus 220 via signal line 230. The processor 225 is communicatively coupled to the bus 220 via signal line 234. The memory 227 is communicatively coupled to the bus 220 via the signal line 236. The communication unit 245 is communicatively coupled to the bus 220 via signal line 238. In some embodiments, one or more of the elements of the realistic roadway virtualization system 199 may share a signal line for communication with the bus 220.

The virtualization application 210 includes a code and routines configured to generate a virtual environment that includes a virtual roadway system for testing an automobile design. The virtualization application 210 may include a roadway virtualization software. The virtualization application 210 may be stored on the memory 227 and accessible by the processor 225 for execution so that the virtualization application 210 may provide its functionality.

In some embodiments, the realism system 299 is a plug-in installed in the virtualization application 210.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors 225 may be included. The processor 225 may include a graphical processing unit. Other processors, operating systems, sensors, displays, and physical configurations may be possible.

The memory 227 is a tangible storage medium that stores instructions or data that may be accessed and executed by the processor 225. The instructions or data may include code for performing the techniques described herein. The memory 227 may include a dynamic random access memory (DRAM) device, a static random access memory (SRAM) device, flash memory, or some other memory device. In some implementations, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The virtualization data 299 may include graphical data describing a virtual environment. For example, the virtual environment generated by the virtualization application 210 may be described by the virtualization data.

The automobile design data 297 may describe a virtual automobile. The virtual automobile may be tested in the virtual environment described by the virtualization data 299.

In some embodiments, the memory 227 stores any data necessary for the virtualization application 210 to provide its functionality.

The communication unit 245 may include hardware that transmits and receives data to and from the network 105. In some implementations, the communication unit 245 includes a port for direct physical connection to the network 105 or to another communication channel. For example, the communication unit 245 includes a USB, SD, CAT-5, or similar port for wired communication with the network 105. In some implementations, the communication unit 245 includes a wireless transceiver for exchanging data with the network 105 or other communication channels using one or more wireless communication methods, including IEEE 802.11, IEEE 802.16, Bluetooth®, or another suitable wireless communication method.

In some implementations, the communication unit 245 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some implementations, the communication unit 245 includes a wired port and a wireless transceiver. The communication unit 245 also provides other conventional connections to the network 105 for distribution of files or media objects using standard network protocols including TCP/IP, HTTP, HTTPS, and SMTP, etc.

In some implementations, the realistic roadway virtualization system 199 includes one or more of the following: a communication module 202; an import module 204; a determination module 206; and a GUI module 208.

The communication module 202 is communicatively coupled to the bus 220 via signal line 222. The import module 204 is communicatively coupled to the bus 220 via signal line 224. The determination module 206 is communicatively coupled to the bus 220 via signal line 226. The GUI module 208 is communicatively coupled to the bus 220 via signal line 228.

The communication module 202 may include code and routines configured to handle communications between the realistic roadway virtualization system 199 and other components of the realistic roadway virtualization system 199. In some implementations, the communication module 202 can include a set of instructions executable by the processor 225 to provide the functionality described below for handling communications between the realistic roadway virtualization system 199 and other components of the environment 100 described above with reference to FIG. 1. In some implementations, the communication module 202 can be stored in the memory 227 of the realistic roadway virtualization system 199 and can be accessible and executable by the processor 225.

The communication module 202 sends and receives data, via the communication unit 245, to and from the network 105. For example, the communication module 202 receives, via the communication unit 245, the roadway realism data 140 from the network 105.

In some embodiments, the communication module 202 receives data from components of the realistic roadway virtualization system 199 and stores the data in the memory 227. For example, the communication module 202 receives the virtualization data 299 from the virtualization application 210 and stores the virtualization data 299 in the memory 227.

In some embodiments, the communication module 202 receives the mobility input 188 and the accessibility input 177 and stores them in the memory 227.

The import module 204 may include code and routines configured to import the roadway realism data 140.

In some embodiments, the import module 204 analyses the plurality of real world road models included in the roadway realism data 140 and assigns a mobility value and an accessibility value to each real world road model included in the plurality of real world road models. For example, the realism system may estimate, for each real world road model included in the plurality of real world road models, an ability of an automobile traveling on a real world roadway system constructed based on that model to move from place to place on the real world roadway system; the realism system may assign the mobility value to the real world road model based on the estimate. In another example, the realism system may estimate, for each real world road model included in the plurality of real world road models, an ability of an automobile to access the real world roadway system and exit the real world roadway system; the realism system may assign the accessibility value to the real world road model based on the estimate.

In some implementations, the import module 204 can be stored in the memory 227 of the realistic roadway virtualization system 199 and can be accessible and executable by the processor 225.

The determination module 206 may include code and routines configured to determining the plurality of roadway inputs based on the roadway realism data 140, the mobility input 188 and the accessibility input 177.

For example, the roadway realism data 140 may describe plurality of real world roadway models. One or more of the real world roadway models may be associated with a different real world roadway system. The different real world roadway systems may be described by different sets of roadway parameters. The different real world roadway systems may also be associated with their own mobility value or accessibility value. For example, each of the real world roadway models included in the roadway realism data 140 may include its own set of roadway parameters and be associated with (1) a mobility value and (2) an accessibility value. The determination module 206 may select, from the plurality of real world roadway models described by the roadway realism data 140, a plurality of real world road models whose mobility values and accessibility values at least substantially match the mobility function and the accessibility function included in the mobility input 188 and the accessibility input 177, respectively. The determination module 206 may then determine that the set of roadway parameters associated with the selected roadway models are the set of roadway inputs 155 used by the virtualization application 210 to generate the one or more virtual roadway systems that are included in the virtual environment described by the virtualization data 299.

In some embodiments, when selecting the plurality of real world road models whose mobility values and accessibility values at least substantially match the mobility function and the accessibility function, the determination module 206 may configure the selection so that one or more virtual roadway systems includes typical and extreme scenarios for testing the automobile design described by the automobile design data 297. For example, the memory 227 may store distribution data that describes a distribution of scenarios that should be included in the one or more virtual roadway systems and the determination module 206 operates a subroutine to check the one or more virtual roadway systems to ensure that the distribution described by the distribution data is satisfied.

In some embodiments, the determination module 206 can be stored in the memory 227 of the realistic roadway virtualization system 199 and can be accessible and executable by the processor 225.

The GUI module 208 may input the plurality of roadway inputs into a plurality of fields included in the virtualization application 210. The plurality of fields may include a set of fields for inputting values for parameters that are required by the virtualization application 210 to generate a virtual roadway system in the virtual environment. The virtualization application 210 is executed using the plurality of roadway inputs as inputs to the plurality of fields. The virtualization application 210 generates, based on the plurality of roadway inputs, a graphical display output including the virtual environment and the virtual roadway system.

In some embodiments, the GUI module 208 can be stored in the memory 227 of the realistic roadway virtualization system 199 and can be accessible and executable by the processor 225.

In some embodiments, the realism system 299 provides numerous benefits to the virtualization application 210. For example, without the realism system 299 the virtualization application cannot design virtual roadway systems based on (1) a mobility criterion and (2) an accessibility criterion, which is the approach applied by the U.S. Department of Transportation Federal Highway Administration. As a result, the virtual roadway systems outputted by a virtualization application 210 that does not include or work with the realism system 299 does not conform to accepted norms for roadway design and may not model truly realistic virtual roadway systems.

Another example benefit provided by the realism system 299 and not found in any deployments of the virtualization application. 210 that do not include the realism system 299 is the ability, in some embodiments, to map a mobility criterion and an accessibility criterion to the specific roadway parameters that are required to construct instances of virtual roadways in the virtual environment. Existing standalone versions of the virtualization application 210 do not include this functionality which is provided by some embodiments of the realism system 299.

Yet another benefit provided by the realistic roadway virtualization system 199 including the realism system 299, according to some embodiments, is the ability to improve the performance of the virtualization application 210 by making it easier to operate by a broader group of users who may not have specialized knowledge about roadway design. For example, in some embodiments the user simply inputs a number that quantifies a value for mobility or accessibility (i.e., input to the system), then the system 199 will automatically generate one or more different virtual roadway systems that meet the criteria.

Example Methods

Figure 3A:
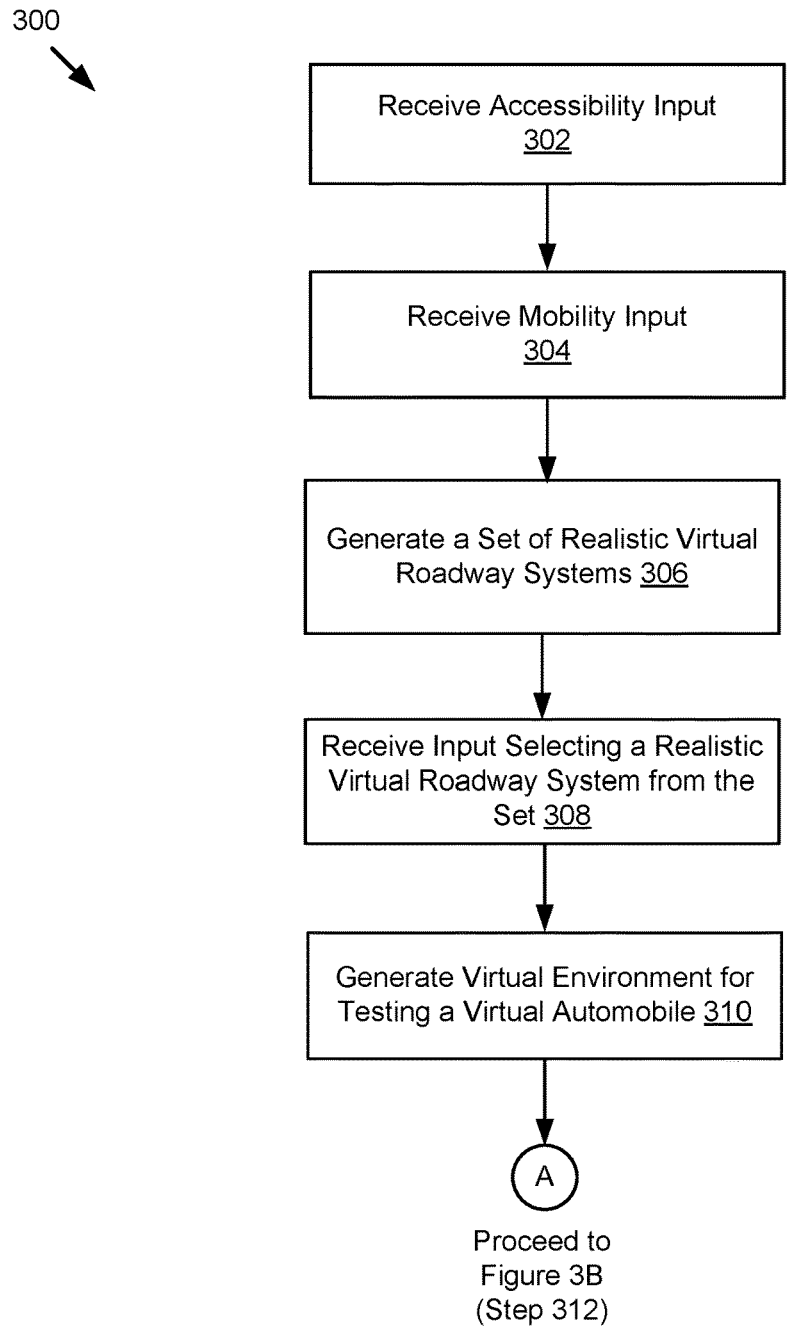
FIGS. 3A and 3B are a flowchart of an example method for generating a virtual environment for testing an automobile design.
Figure 3B:
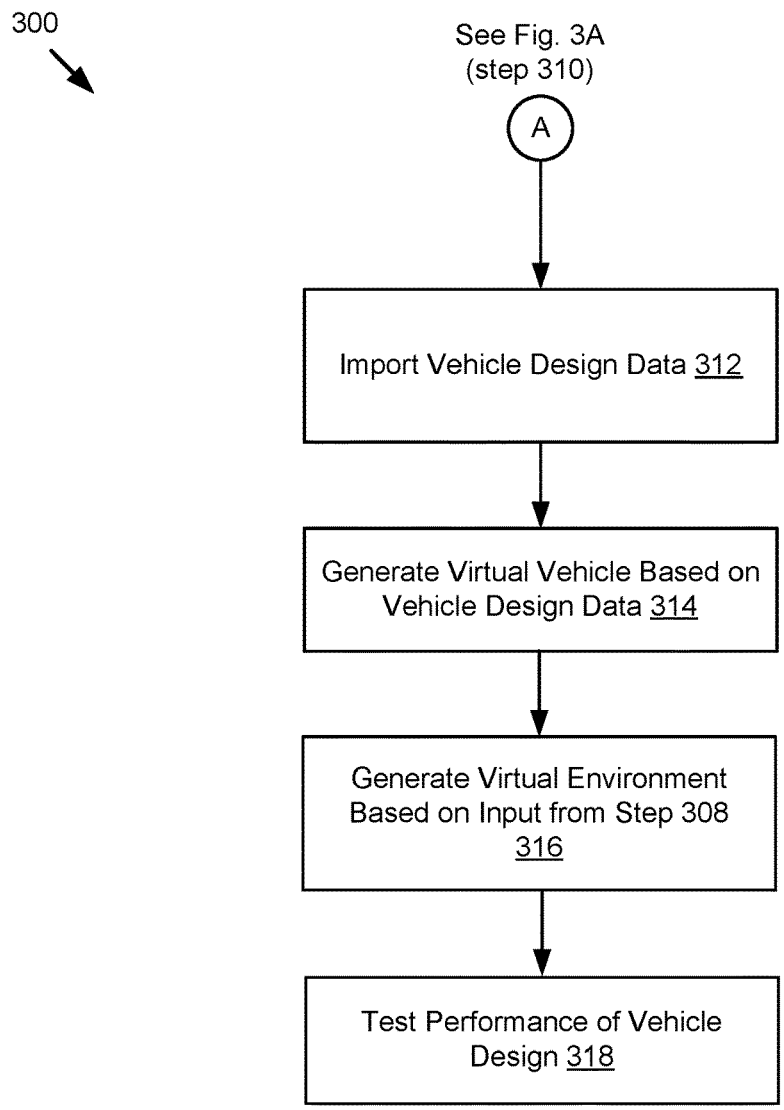

FIGS. 3A and 3B are a flowchart of an example method 300 for generating a virtual environment for testing an automobile design.

At step 302 an accessibility input is received. At step 304 a mobility input is received. At step 306 a set of realistic virtual roadway systems is generated. At step 308 an input is received selecting a realistic virtual roadway system from the set generated in step 306. At step 310 a virtual environment for testing a virtual automobile 310 is generated.

Referring now to FIG. 3B, at step 312 the vehicle design data is imported. At step 314 the virtual vehicle is generated based on the vehicle design data. At step 316 the virtual environment is generated that includes the virtual vehicle. At step 318 the performance of the vehicle design is tested based on the performance of the virtual vehicle on the virtual roadway system.

Example GUI

Figure 4:
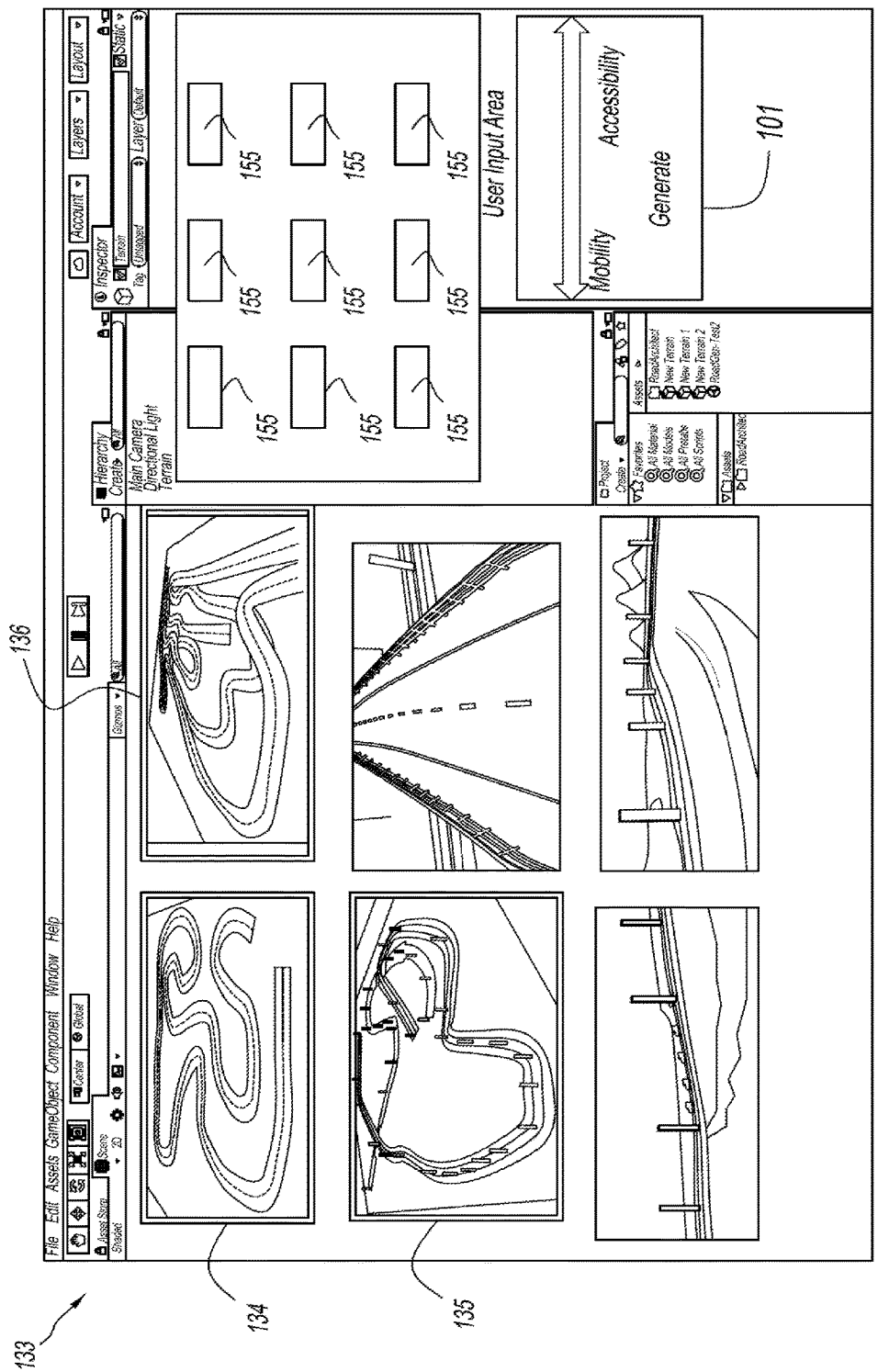
FIG. 4 is an example graphical user interface provided by the realistic virtualization system.

FIG. 4 is an example GUI 133 provided by the realistic virtualization system. The example GUI 133 includes an example of a plurality of realistic virtual roadway systems 134, 135, 136 and an example of a user input 101.

The implementations of the specification can also relate to an apparatus for performing the operations described herein. This apparatus may be specially constructed for the required purposes, or it may include a special-purpose computer selectively activated or reconfigured by a computer program stored in the computer. Such a computer program may be stored in a non-transitory computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware implementations, some entirely software implementations, or some implementations containing both hardware and software elements. In some implementations, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited to, keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the implementations of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those that practice the art of computer programming. Additionally, the disclosure is in no way limited to implementations in any specific programming language, or for any specific operating system or environment. Accordingly, the disclosure is intended to be illustrative, but not limiting, of the scope of the specification, which is set forth in the following claims.

What is claimed is:

1. A system to provide a graphical display output including a virtual roadway system for testing an automobile design, the system comprising:
a realistic roadway virtualization system including a non-transitory memory, a processor, a virtualization application, and a realism system, wherein the virtualization application and the realism system are stored in non-transitory memory which is communicatively coupled to the processor;
wherein the virtualization application includes instructions that, responsive to being executed by the processor, cause the processor to generate a virtual environment including a virtual roadway system;
wherein the virtualization application includes a plurality of fields for inputting a plurality of roadway inputs that define a plurality of parameters describing the virtual roadway system;
wherein the virtualization application generates the virtual environment including the virtual roadway system based on the plurality of roadway inputs;
wherein the realism system includes instructions that, responsive to being executed by the processor, cause the processor to perform steps including:
importing a set of roadway realism data describing a plurality of real world roadway models;
receiving, from a client device, a mobility input and an accessibility input, wherein the mobility input describes a mobility function for the virtual roadway system and the accessibility input describes an accessibility function for the virtual roadway system;
determining the plurality of roadway inputs based on the set of roadway realism data, the mobility input and the accessibility input; and
inputting the plurality of roadway inputs into the plurality of fields;
wherein the virtualization application generates a graphical display output including the virtual environment, which includes the virtual roadway system, based on the plurality of roadway inputs; and
wherein the virtualization application provides the virtual environment to the client device.

2. The system of claim 1, wherein the realism system is a plug-in installed in the virtualization application.

3. The system of claim 1, wherein the mobility function is a first number that defines an ability of a virtual automobile traveling on the virtual roadway system to move from place to place on the virtual roadway system.

4. The system of claim 3, wherein the first number is a percentage.

5. The system of claim 1, wherein the accessibility function is a second number that defines an ability of a virtual automobile to access the virtual roadway system and exit the virtual roadway system.

6. The system of claim 5, wherein the second number is a percentage.

7. The system of claim 1, wherein the mobility function is a first number that defines a first ability of an automobile traveling on the virtual roadway system to move from place to place on the virtual roadway system and the accessibility function is a second number that defines a second ability of the automobile to access the virtual roadway system and exit the virtual roadway system, and wherein a sum of the first number and the second number is 1 or 100%.

8. The system of claim 1, wherein the plurality of real world roadway models is generated based on a plurality of real world roadway systems.

9. The system of claim 1, wherein the mobility function and the accessibility function are provided as inputs to the client device.

10. The system of claim 1, wherein the plurality of real world roadway models are each associated with (1) a mobility value, (2) an accessibility value and (3) a set of roadway parameters that describe a real world roadway system, and determining the plurality of roadway inputs includes selecting, from the plurality of real world roadway models, a real world road model whose mobility value and accessibility value at least substantially match the mobility function and the accessibility function and then determining that the set of roadway parameters associated with the selected roadway model are the plurality of roadway inputs.

11. The system of claim 10, wherein the realism system analyzes the plurality of real world roadway models and assigns the mobility value and the accessibility value to each real world roadway model included in the plurality of real world roadway models.

12. The system of claim 11, wherein the realism system estimates, for each real world roadway model included in the plurality of real world roadway models, an ability of an automobile traveling on the real world roadway system to move from place to place on the real world roadway system and assigns the mobility value to the real world roadway model based on the estimate.

13. The system of claim 11, wherein the realism system estimates, for each real world roadway model included in the plurality of real world roadway models, an ability of an automobile to access the real world roadway system and exit the real world roadway system and assigns the accessibility value to the real world roadway model based on the estimate.

14. A method to provide a graphical display output including a virtual roadway system for testing an automobile design, the method comprising:
importing a set of roadway realism data describing a plurality of real world roadway models to a realism system included in a virtualization application, wherein the virtualization application includes instructions that, responsive to being executed by a processor, cause the processor to generate a virtual environment including a virtual roadway system and the virtualization application includes a plurality of fields for inputting a plurality of roadway inputs that define a plurality of parameters describing the virtual roadway system;
receiving, by the realism system from a client device, a mobility input and an accessibility input, wherein the mobility input describes a mobility function for a virtual roadway system and the accessibility input describes an accessibility function for the virtual roadway system;
determining, by the realism system, the plurality of roadway inputs based on the set of roadway realism data, the mobility input and the accessibility input; and
inputting, by the realism system, the plurality of roadway inputs into the plurality of fields included in the virtualization application;
generating, by the virtualization application, a graphical display output including the virtual environment which includes the virtual roadway system, wherein the graphical display output is generated based on the plurality of roadway inputs; and
providing, by the virtualization application, the graphical display output including the virtual environment and the virtual roadway system to the client device.

15. The method of claim 14, wherein the realism system is a plug-in installed in the virtualization system.

16. The method of claim 14, wherein the mobility function is a first percentage that defines a first ability of a virtual automobile traveling on the virtual roadway system to move from place to place on the virtual roadway system and the accessibility function is a second percentage that defines a second ability of the virtual automobile to access the virtual roadway system and exit the virtual roadway system and a sum of the first percentage and the second percentage equals 1 or 100%.

17. The method of claim 14, wherein the plurality of real world roadway models are each associated with (1) a mobility value, (2) an accessibility value and (3) a set of roadway parameters that describe a real world roadway system, and determining the plurality of roadway inputs includes selecting, from the plurality of real world roadway models, a real world road model whose mobility value and accessibility value at least substantially match the mobility function and the accessibility function and then determining that the set of roadway parameters associated with the selected roadway model are the plurality of roadway inputs.

18. The method of claim 14, wherein the realism system analyzes the plurality of real world roadway models and assigns a mobility value and an accessibility value to each real world roadway model included in the plurality of real world roadway models and wherein the realism system estimates, for each real world roadway model included in the plurality of real world roadway models, an ability of an automobile traveling on a real world roadway system to move from place to place on the real world roadway system and assigns the mobility value to the real world roadway model based on the estimate.

19. The method of claim 18, wherein the realism system estimates, for each real world roadway model included in the plurality of real world roadway models, an ability of an automobile to access the real world roadway system and exit the real world roadway system and assigns the accessibility value to the real world roadway model based on the estimate.

20. A non-transitory memory comprising computer code which, when executed by a processor, causes the processor to perform steps comprising:

importing a set of roadway realism data describing a plurality of real world roadway models to a realism system that is a plug-in installed in a virtualization application, wherein the virtualization application includes instructions that, responsive to being executed by the processor, cause the processor to generate a virtual environment including a virtual roadway system and the virtualization application includes a plurality of fields for inputting a plurality of roadway inputs that define a plurality of parameters describing the virtual roadway system;

generating, by the realism system, a first graphical display output including a slider input portion that includes a graphical slider;

receiving, by the realism system from a client device, a mobility input and an accessibility input, wherein the mobility input describes a mobility function for a virtual roadway system and the accessibility input describes an accessibility function for the virtual roadway system;

determining, by the realism system, the plurality of roadway inputs based on the set of roadway realism data, the mobility input and the accessibility input; and inputting, by the realism system, the plurality of roadway inputs into the plurality of fields included in the virtualization application;

generating, by the virtualization application, a second graphical display output including the virtual environment which includes the virtual roadway system, wherein the second graphical display output is generated based on the plurality of roadway inputs; and providing, by the virtualization application, the second graphical display output including the virtual environment and the virtual roadway system to the client.

* * * * *